United States Patent
Kabasawa

(10) Patent No.: US 7,671,592 B2
(45) Date of Patent: Mar. 2, 2010

(54) MAGNETIC RESONANCE IMAGING APPARATUS AND MAGNETIC RESONANCE IMAGE DISPLAYING METHOD

(75) Inventor: Hiroyuki Kabasawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 12/201,724

(22) Filed: Aug. 29, 2008

(65) Prior Publication Data

US 2009/0058419 A1 Mar. 5, 2009

(30) Foreign Application Priority Data

Aug. 29, 2007 (JP) ............... 2007-222320

(51) Int. Cl.
*G01V 3/00* (2006.01)
(52) U.S. Cl. .................... 324/309; 324/307
(58) Field of Classification Search ............ 324/309, 324/307
See application file for complete search history.

(56) References Cited

U.S. PATENT DOCUMENTS

| | | | |
|---|---|---|---|
| 4,516,582 A | 5/1985 | Redington | |
| 5,058,176 A * | 10/1991 | Shimazaki et al. | 382/132 |
| 5,261,050 A * | 11/1993 | Fox et al. | 345/506 |
| 5,900,732 A * | 5/1999 | Felmlee et al. | 324/309 |
| 6,526,305 B1 | 2/2003 | Mori | |
| 6,806,705 B2 | 10/2004 | van Muiswinkel et al. | |
| 6,992,484 B2 | 1/2006 | Frank | |
| 6,998,841 B1 | 2/2006 | Tamez-Pena et al. | |
| 7,218,763 B2 * | 5/2007 | Belykh et al. | 382/128 |
| 7,319,328 B1 | 1/2008 | Karmonik | |
| 7,355,403 B2 | 4/2008 | Chakraborty | |
| 7,355,407 B1 | 4/2008 | Zhang | |
| 7,355,597 B2 | 4/2008 | Laidlaw et al. | |

FOREIGN PATENT DOCUMENTS

JP 2004-081657 3/2004
JP 2006-262928 10/2006

OTHER PUBLICATIONS

Shigeki Aoki et al., "Display Methods for Diffusion Tensor Color Display", "Better Understand What Diffusion MRI is", pp. 108 & 109, Shujunsha Co., Ltd.
"Standardization of DWI (Diffusion Weighted Image) Display", [online], [Searched on Jul. 24, 2007], Internet <URL: http//asist.umin.jp/assignment-detail01.htm>.

* cited by examiner

*Primary Examiner*—Louis M Arana
(74) *Attorney, Agent, or Firm*—Armstrong Teasdale LLP

(57) ABSTRACT

A magnetic resonance imaging apparatus includes a scan section which executes a diffusion weighted imaging pulse sequence on an imaging area of a subject within a static magnetic field space thereby to acquire magnetic resonance signals, an image generating part which generates an image with respect to the imaging area, based on the magnetic resonance signals acquired by the scan section, a display unit which displays the image generated by the image generating part on a display screen thereof, and a window setting part which sets a window level and a window width at the time that the display unit displays the image, based on diffusion parameters calculated from the magnetic resonance signals acquired by the scan section. The display unit displays the image on the display screen by the window level and the window width both set by the window setting part.

20 Claims, 4 Drawing Sheets

US 7,671,592 B2

MAGNETIC RESONANCE IMAGING APPARATUS AND MAGNETIC RESONANCE IMAGE DISPLAYING METHOD

CROSS REFERENCE TO RELATED APPLICATIONS

This application claims the benefit of Japanese Patent Application No. 2007-222320 filed Aug. 29, 2008, which is hereby incorporated by reference in its entirety.

BACKGROUND OF THE INVENTION

The subject matter disclosed herein relates to a magnetic resonance imaging (MRI) apparatus and a magnetic resonance image displaying method. The present invention relates particularly to a magnetic resonance imaging apparatus and a magnetic resonance image displaying method each of which generates a magnetic resonance (MR) image with respect to an imaging area of a subject, based on magnetic resonance (MR) signals acquired by executing a diffusion weighted imaging (DWI) pulse sequence on the imaging area of the subject within a static magnetic field space and thereafter displays the generated magnetic resonance image on a display screen.

A magnetic resonance imaging apparatus has frequently been used for medical applications in particular as an apparatus for imaging a subject using a nuclear magnetic resonance (NMR) phenomenon.

In a magnetic resonance imaging apparatus, an imaging area of a subject is held or accommodated within a space formed with a static magnetic field thereby to arrange spins of proton lying in the imaging area in the direction of the static magnetic field, and a magnetization vector thereof is produced. An RF pulse having a resonant frequency is applied to generate a nuclear magnetic resonance phenomenon, thereby flipping the spins of the proton and changing the magnetization vector of the proton. Thereafter, the magnetic resonance imaging apparatus receives magnetic resonance signals produced when the proton is returned to the original state of magnetization vector, and reconstructs a magnetic resonance image such as a slice image with respect to the imaging area, based on the received magnetic resonance signals.

In this type of magnetic resonance imaging apparatus, it has been practiced to execute a diffusion weighted imaging pulse sequence on the imaging area of the subject within the static magnetic field space thereby to acquire the magnetic resonance signals and thereafter generate a diffusion weighted image or the like as a magnetic resonance image with respect to the imaging area, based on the acquired magnetic resonance signals (refer to, for example, Shigeki Aoki et al., "Better Understand What Diffusion MRI is", SHUJUNSHA Co., Ltd. and Japanese Unexamined Patent Publication No. 2006-262928).

The diffusion weighted imaging pulse sequence is a pulse sequence for applying so-called MPG (Motion Probing Gradient) pulses before and after a refocusing pulse in a spin echo (SE) method for transmitting RF pulses of, for example, an excitation pulse whose flip angle is 90° and a refocusing pulse whose flip angle is 180°. A b-factor of each MPG pulse is adjusted and executed. Here, the diffusion weighted imaging pulse sequence is executed by, for example, a pulse sequence of a spin echo method to which an SE-EPI (Echo Planar Imaging) method or an FSE (Fast Spin Echo) method is applied. This pulse sequence is designated as, for example, a Stejskal-Tanner method or a PGSE (Pulsed Gradient Spin Echo) method.

Described specifically, upon carrying out the diffusion weighted imaging pulse sequence, the pulse sequence is executed by the PGSE method under conditions of plural b-factors. Thus, a plurality of diffusion weighted images are generated with respect to an imaging area thereof so as to correspond to the conditions of the plural b-factors respectively. Here, the pulse sequence is executed on the condition that the b-factor is set to 0, thereby to generate a T2 weighted image called a b0 image with respect to the imaging area.

Using the generated T2 weighted image and diffusion weighted images, diffusion parameters each indicative of such a characteristic that water molecules contained in the imaging area are diffused, as in the case of an eigen or intrinsic value and vector of a diffusion tensor, and a fractional anisotropy (FA: Fractional Anisotropy) value, a mean diffusivity (MD) value, a relative anisotropy value, etc., are calculated to generate a diffusion tensor image. A magnetic resonance image such as a fractional anisotropy image in which fractional anisotropy values are mapped, a nerve fiber image in which each nerve fiber is imaged by tractgraphy, or the like is generated and displayed (refer to, for example, Japanese Unexamined Patent Publication No. 2004-81657).

The magnetic resonance image generated in the above-described manner is displayed on a display screen by appropriately setting a window level (WL) and a window width (WW) respectively.

When, for example, diagnostic imaging of each acute phase cerebral infarction is conducted, a window level and a window width are set to accurately identify an infarction area at a subject therefor and a diffusion weighted image is displayed on a display screen of a display so as to correspond to the set window level and window width.

Described specifically, an operator observes a T2 weighted image generated with respect to an imaging area in a manner similar to the diffusion weighted image and sets a region of interest (ROI) to an area corresponding to thalamus of a subject at the T2 weighted image. Thereafter, display conditions are set in such a manner that each pixel value in the region of interest assumes a window width and a value equal to half of the pixel value assumes a window level. That is, the window width is set in such a manner that the pixel value in the region of interest is brought to an upper limit value of brightness of a display image and a value set as the reference when each pixel value in the region of interest is determined, is brought to a lower limit value of the brightness of the display image. Further, the center value of the window width is set so as to assume a window level. Then, the diffusion weighted image is displayed on the display screen so as to correspond to the display conditions. Thus, since the diffusion weighted image is displayed on the display screen with a high contrast between an area intended for diagnosis thereat and an area other than the area, an appropriate and efficient diagnosis can be realized (refer to, for example, "Standardization of DWI (Diffusion Weighted Image) Display", [online], [Searched on Jul. 24, 2007], Internet <URL: http//asis-t.umin.jp/assignment-detail01.htm>).

Since, however, the area corresponding to the thalamus at the T2 weighted image is not displayed with the high contrast with respect to other area in the above, the operator needs to set the region of interest to the area corresponding to the thalamus. It is therefore difficult to automatically set the display conditions such as the window level and the window width. Since a so-called human error might occur when the operator sets the region of interest to the area corresponding to the thalamus at the T2 weighted image, there is a case in which it is difficult to display the diffusion weighted image on the display screen at a proper window level and width. With these views, it might be difficult to enhance diagnostic efficiency.

When the nerve fiber image generated by tractgraphy is displayed in addition to the above, a window level and a window width might not be set property even to each of images generated by execution of the diffusion weighted imaging pulse sequence as in the case of the T2 weighted image and the diffusion weighted image or the like each used as a background image. Therefore, there is a case in which the image is not properly displayed on the display screen and an improvement in diagnostic efficiency is difficult.

BRIEF DESCRIPTION OF THE INVENTION

It is desirable that the problems described previously are solved.

In a first aspect, The invention provides a magnetic resonance imaging apparatus including a scan section which executes a diffusion weighted imaging pulse sequence on an imaging area of a subject within a static magnetic field space thereby to acquire magnetic resonance signals, an image generating part which generates an image with respect to the imaging area, based on the magnetic resonance signals acquired by the scan section, a display unit which displays the image generated by the image generating part on a display screen thereof, and a window setting part which sets a window level and a window width at the time that the display unit displays the image, based on diffusion parameters calculated from the magnetic resonance signals acquired by the scan section, wherein the display unit displays the image on the display screen by the window level and the window width both set by the window setting part.

Preferably, the image generating part generates each of a b0 image and a diffusion weighted image as the image, based on the magnetic resonance signals.

Preferably, the image generating part generates a T2 weighted image as the b0 image.

Preferably, the window setting part sets the window level and the window width using a fractional anisotropy image in which fractional anisotropy values calculated as the diffusion parameters, based on the T2 weighted image and the diffusion weighted image are mapped as pixel values.

Preferably, the window setting part executes threshold processing on the fractional anisotropy image and thereafter sets the window level and the window width, based on pixel values of the fractional anisotropy image subjected to the threshold processing.

Preferably, the window setting part extracts an area corresponding to a specific tissue at the fractional anisotropy image by executing the threshold processing.

Preferably, the window setting part executes the threshold processing, based on the corresponding fractional anisotropy value.

Preferably, the window setting part executes the threshold processing, based on a mean diffusivity value calculated as the diffusion parameter using the T2 weighted image and the diffusion weighted image.

Preferably, the window setting part performs integrating processing on the pixel values of the fractional anisotropy image subjected to the threshold processing and pixel values of the T2 weighted image thereby to generate a mask image and thereafter sets the window level and the window width using pixel values of the generated mask image.

Preferably, the window setting part executes weighted addition average processing with the pixel values of the mask image as weights on the pixel values of the T2 weighted image thereby to calculate an average value, and thereafter sets the average value as the window width and sets a value equal to half of the average value as the window level.

Preferably, the window setting part executes the weighted addition average processing with the pixel values of the mask image as the weights on pixel values of the diffusion weighted image thereby to calculate an average value, and thereafter sets the average value as the window level and sets a value equal to twice the average value as the window width.

In a second aspect, the invention provides a magnetic resonance image displaying method including an image generating step of generating an image with respect to an imaging area of a subject, based on magnetic resonance signals acquired by executing a diffusion weighted imaging pulse sequence on the imaging area within a static magnetic field space, a display step of displaying the image generated by the image generating step on a display screen, and a window setting step of setting a window level and a window width at the time that the image is displayed on the display screen, based on diffusion parameters calculated from the magnetic resonance signals, wherein at the display step, the image is displayed on the display screen by the window level and the window width both set by the window setting step.

Preferably, at the image generating step, each of a b0 image and a diffusion weighted image is generated as the image, based on the magnetic resonance signals.

Preferably, at the image generating step, a T2 weighted image is generated as the b0 image.

Preferably, at the window setting step, the window level and the window width are set using a fractional anisotropy image mapped with, as pixel values, fractional anisotropy values calculated as the diffusion parameters, based on the T2 weighted image and the diffusion weighted image generated by the image generating step.

Preferably, at the window setting step, threshold processing is executed on the fractional anisotropy image and thereafter the window level and the window width are set based on pixel values of the fractional anisotropy image subjected to the threshold processing.

Preferably, at the window setting step, an area corresponding to a specific tissue is extracted at the fractional anisotropy image by executing the threshold processing.

Preferably, at the window setting step, the threshold processing is executed based on the corresponding fractional anisotropy value.

Preferably, at the window setting step, the threshold processing is executed based on a mean diffusivity value calculated as the diffusion parameter using the T2 weighted image and the diffusion weighted image.

Preferably, at the window setting step, integrating processing is performed on the pixel values of the fractional anisotropy image subjected to the threshold processing and pixel values of the T2 weighted image thereby to generate a mask image and thereafter the window level and the window width arc set using pixel values of the generated mask image.

Preferably, at the window setting step, weighted addition average processing with the pixel values of the mask image as weights is executed on the pixel values of the T2 weighted image thereby to calculate an average value, and thereafter the average value is set as the window width and a value equal to half of the average value is set as the window level.

Preferably, at the window setting step, the weighted addition average processing with the pixel values of the mask image as the weights is performed on pixel values of the diffusion weighted image thereby to calculate an average value, and thereafter the average value is set as the window level and a value equal to twice the average value is set as the window width.

According to the invention, there can be provided a magnetic resonance imaging apparatus and a magnetic resonance image displaying method both capable of properly setting and displaying a window level and a window width to each image generated by executing a diffusion weighted imaging pulse sequence and easily enhancing diagnostic efficiency.

Further objects and advantages of the present invention will be apparent from the following description of the preferred embodiments of the invention as illustrated in the accompanying drawings.

DETAILED DESCRIPTION OF THE INVENTION

A respective one embodiment according to the invention will hereinafter be explained with reference to the accompanying drawings.

Figure 1:
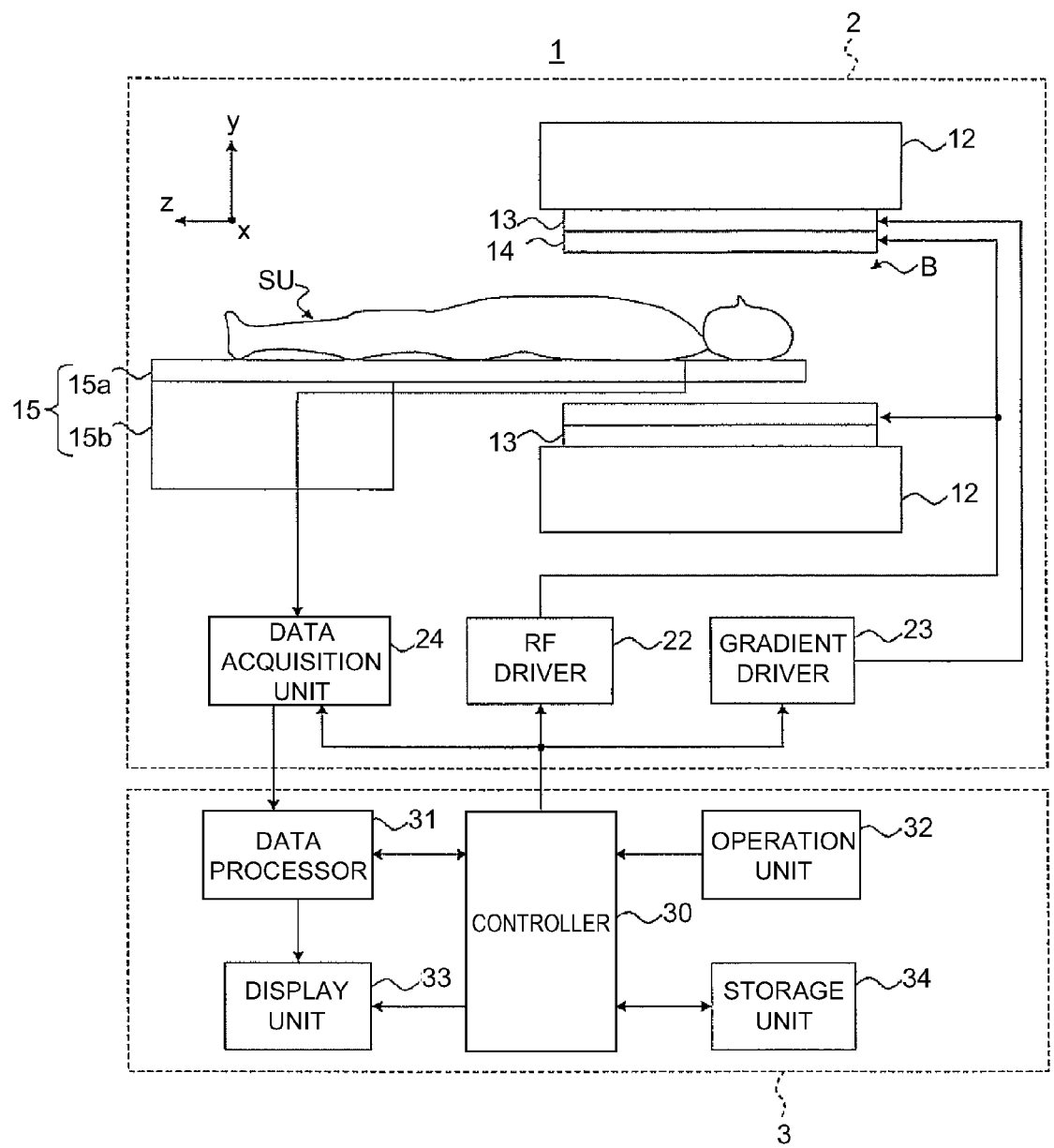
FIG. 1 is a configurational diagram showing a construction of a magnetic resonance imaging apparatus 1 illustrative of an embodiment 1 according to the invention.

FIG. 1 is a constructional diagram showing a construction of a magnetic resonance imaging apparatus 1 illustrative of an embodiment 1 according to the invention.

As shown in FIG. 1, the magnetic resonance imaging apparatus 1 of the present embodiment has a scan section 2 and an operation console section 3.

The magnetic resonance imaging apparatus 1 is constructed in such a manner that the scan section 2 scans an imaging area of a subject SU within an imaging space B formed with a static magnetic field to acquire magnetic resonance signals and thereafter the operation console section 3 generates a magnetic resonance image with respect to the imaging area, based on the magnetic resonance signals.

The scan section 2 will be explained.

As shown in FIG. 1, the scan section 2 has a static magnetic field magnet unit 12, a gradient coil unit 13, an RF coil unit or part 14, a subject moving unit 15, an RF driver 22, a gradient driver 23 and a data acquisition unit 24. The scan section 2 scans the imaging area of the subject SU, based on a control signal outputted from the operation console section 3.

Here, the scan section 2 is formed so as to assume or take a cylindrical shape, for example and holds or accommodates therein the subject SU with a columnar space at its central part as the imaging space B. When the scan section 2 scans the imaging area of the subject SU, the RF coil unit 14 transmits an RF pulse so as to excite spins of the imaging area of the subject SU placed on the subject moving unit 15, and the gradient coil unit 13 applies a gradient pulse to the imaging area of the subject SU to which the RF pulse is transmitted. The RF coil unit 14 receives each magnetic resonance signal generated at the imaging area of the subject SU.

In the present embodiment, although described later in terms of details, the scan section 2 executes a diffusion weighted imaging pulse sequence on the imaging area of the subject SU within the imaging space B thereby to acquire magnetic resonance signals. Described specifically, the scan section 2 executes a scan for the imaging area of the subject SU in accordance with a pulse sequence for applying MPG pulses before and after a refocusing pulse, using a spin echo method for transmitting RF pulses of an excitation pulse whose flip angle is 90° and a refocusing pulse whose flip angle is 180°. That is, the scan section 2 executes a scan by a PGSE method.

Respective constituent members or components that constitute the scan section 2 will be explained sequentially.

The static magnetic field magnet unit 12 includes a super-conductive magnet (not shown) and forms a static magnetic field in the imaging space B in which the subject SU is accommodated or held. Here, the static magnetic field magnet unit 12 forms the static magnetic field so as to extend along a body-axis direction (z direction) of the subject SU placed on the subject moving unit 15. That is, the static magnetic field magnet unit 12 is of a horizontal magnetic field type. In addition to it, the static magnetic field magnet unit 12 is of a vertical magnetic field type and may form a static magnetic field along the direction in which a pair of permanent magnets faces each other.

The gradient coil unit 13 forms a gradient magnetic field in the imaging space B formed with the static magnetic field so as to apply or adds spatial position information to each magnetic resonance signal received by the RF coil unit 14. Here, the gradient coil unit 13 includes three systems so as to correspond to three-axis directions of an X direction, a y direction and a z direction orthogonal to one another. These transmit gradient pulses in a frequency encode direction, a phase encode direction and a slice selection direction according to imaging conditions respectively so as to form gradient magnetic fields. Described specifically, the gradient coil unit 13 applies the gradient magnetic field in the slice selection direction of the subject SU and selects a slice of the subject SU excited by transmission of an RF pulse by the RF coil unit 14. The gradient coil unit 13 applies the gradient magnetic field in the phase encode direction of the subject SU and phase-encodes a magnetic resonance signal from the slice excited by the RF pulse. And the gradient coil unit 13 applies the gradient magnetic field in the frequency encode direction of the subject SU and frequency-encodes the magnetic resonance signal from the slice excited by the RF pulse.

The RF coil unit 14 transmits an RF pulse corresponding to an electromagnetic wave within the imaging space B formed with the static magnetic field to form a high frequency magnetic field, thereby exciting the spins of proton in the imaging area of the subject SU. The RE coil unit 14 receives an electromagnetic wave generated from the excited proton in the imaging area of the subject SU as a magnetic resonance signal.

The subject moving unit 15 has a cradle 15a and a cradle moving part 15b and is configured in such a manner that the cradle moving part 15b moves the cradle 15a between the inside and outside of the imaging space B, based on a control signal outputted from a controller 30. Here, the cradle 15a is a table having a placement surface on which the subject SU is placed. As shown in FIG. 1, the cradle 15a is moved in respective directions corresponding to the horizontal direction xz and the vertical direction y by the cradle moving part 15b and is carried in the imaging space B formed with the static magnetic field and carried out therefrom. The cradle moving part 15b is constructed in such a way as to carry the cradle 15a in the imaging space B to hold the cradle 15a inside the imaging space B from outside and carry out the same to the outside from inside the imaging space B. The cradle moving part 15b is equipped with, for example, a roller type drive mechanism and drives a roller by an actuator to move the cradle 15a in the horizontal direction xz. The cradle moving part 15b is equipped with, for example, an arm type drive mechanism and varies an angle formed between two crossed arms thereby to move the cradle 15a in the vertical direction y.

The RF driver 22 drives the RF coil unit 14 to transmit an RF pulse to within the imaging space B, thereby forming a high frequency magnetic field in the imaging space B. The RF driver 22 modulates a signal sent from an RF oscillator (not shown) to a signal having predetermined timing and predetermined envelope using a gate modulator (not shown) on the basis of the corresponding control signal outputted from the operation console section 3. Thereafter, the RF driver 22 allows an RF power amplifier (not shown) to amplify the signal modulated by the gate modulator and outputs the same to the RF coil unit 14, and allows the RF coil unit 14 to transmit the corresponding RF pulse.

The gradient driver 23 applies a gradient pulse to the gradient coil unit 13 based on the control signal outputted from the operation console section 3 to drive the gradient coil unit 13, thereby to generate a gradient magnetic field within the imaging space B formed with the static magnetic field. The gradient driver 23 has a three-system drive circuit (not shown) in association with the three-system gradient coil unit 13.

The data acquisition unit 24 acquires each magnetic resonance signal received by the RF coil unit 14 based on the control signal outputted from the operation console section 3. Here, the data acquisition unit 24 phase-detects the magnetic resonance signal received by the RF coil unit 14 using a phase detector (not shown) with the output of the RF oscillator (not shown) of the RF driver 22 as a reference signal. Thereafter, the data acquisition unit 24 converts the magnetic resonance signal corresponding to the analog signal into a digital signal by using an A/D converter (not shown) and outputs it therefrom.

The operation console section 3 will be explained.

As shown in FIG. 1, the operation console section 3 has the controller 30, a data processor 31, an operation unit 32, a display or display unit 33 and a storage unit 34.

Respective constituent elements of the operation console section 3 will be described sequentially.

The controller 30 has a computer and a memory that stores programs each of which allows the computer to execute predetermined data processing, and controls respective parts. Here, the controller 30 outputs the control signal to the RF driver 22, gradient driver 23 and data acquisition unit 24 respectively, based on operation data outputted from the operation unit 32, thereby executing a scan. Along with it, the controller 30 outputs control signals to the data processor 31, display unit 33 and storage unit 34 to perform control thereon.

In the present embodiment, although described later in terms of details, the controller 30 allows the computer to function through the corresponding program such that the imaging area of the subject is scanned in accordance with the diffusion weighted imaging pulse sequence as described above, thereby controlling the scan section 2.

The data processor 31 has a computer and a memory that stores therein programs each of which executes predetermined data processing using the computer. The data processor 31 executes data processing, based on the control signal supplied from the controller 30.

Figure 2:
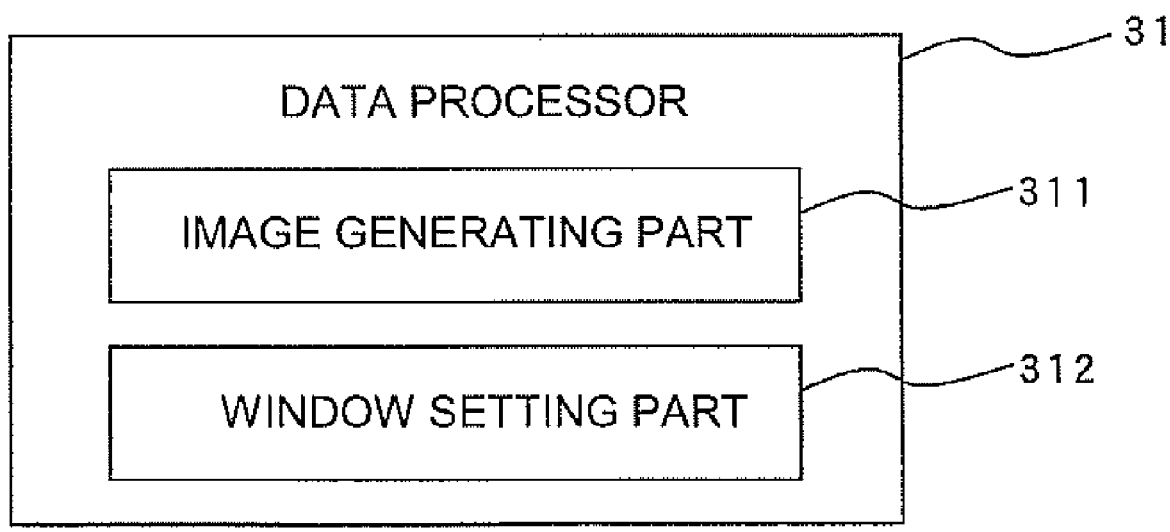
FIG. 2 is a functional block diagram showing a data processor 31 employed in the embodiment 1 according to the invention.

FIG. 2 is a functional block diagram showing the data processor 31 employed in the embodiment 1 according to the invention.

As shown in FIG. 2, the data processor 31 is configured so as to function as both of an image generating part 311 and a window setting part 312 by allowing the program to operate the computer.

The image generating part 311 of the data processor 31 functions so as to set each magnetic resonance signal obtained by allowing the scan section 2 to execute the scan as raw data and so as to generate a magnetic resonance image with respect to the imaging area of the subject SU. The image generating part 311 outputs the generated magnetic resonance image to the display unit 33. Described specifically, the image generating part 311 inversely Fourier-transforms each of the magnetic resonance signals acquired corresponding to a k space thereby to reconstruct a magnetic resonance image.

In the present embodiment as described above, the image generating part 311 reconstructs the magnetic resonance image with respect to the imaging area of the subject SU from the magnetic resonance signals acquired by the scan executed in accordance with the diffusion weighted imaging pulse sequence. Described specifically, the image generating part 311 generates a T2 weighted image and a diffusion weighted image as magnetic resonance images, based on the magnetic resonance signals.

The image generating part 311 calculates fractional anisotropy values as diffusion parameters so as to correspond to respective pixels, based on the generated T2 weighted image and diffusion weighted image. Thereafter, the image generating part 311 performs mapping so as to correspond to the imaging area with the fractional anisotropy values as pixels values, thereby generating each fractional anisotropy image.

The window setting part 312 of the data processor 31 functions so as to set a window level and a window width when the display unit 33 displays an image.

Here, the window setting part 312 sets a window level and a window width at the time that the display unit 33 displays the magnetic resonance images generated by the image generating part 311, based on the diffusion parameters calculated from the magnetic resonance signals acquired by the scan section 2.

In the present embodiment, although described later in terms of details, the window setting part 312 sets the window level and the window width, using each fractional anisotropy image in which the fractional anisotropy values calculated as the diffusion parameters based on the T2 weighted image and diffusion weighted image generated by the image generating part 311 are mapped so as correspond to the imaging area of the subject SU as the pixel values.

The operation unit 32 is constituted of operation devices such as a keyboard, a pointing device and the like. The operation unit 32 inputs operation data from an operator and outputs the same to the controller 30.

The display unit 33 is constituted of a display device such as a CRT and displays each image on its display screen, based on the control signal outputted from the controller 30. For example, the display unit 33 displays images about input items corresponding to the operation data inputted to the operation unit 32 by the operator on the display screen in plural form. Further, the display unit 33 receives data about each magnetic resonance image related to the imaging area, generated based on the magnetic resonance signals acquired from the imaging area of the subject SU from the data processor 31 and displays the magnetic resonance image on the display screen.

In the present embodiment, the display unit 33 displays each magnetic resonance image generated by the image generating part 311 on its display screen as mentioned above. Here, the display unit 33 displays the diffusion weighted image generated as the magnetic resonance image on the display screen so as to correspond to the window level and the window width set by the window setting part 312, for example.

The storage unit 34 includes a memory and stores various data therein. In the storage unit 34, the stored data are accessed by the controller 30 as needed.

The operation of generating and displaying a diffusion weighted image as a magnetic resonance image with respect to an imaging area of a subject SU by the magnetic resonance imaging apparatus 1 illustrative of the embodiment according to the invention will be explained below.

Figure 3:
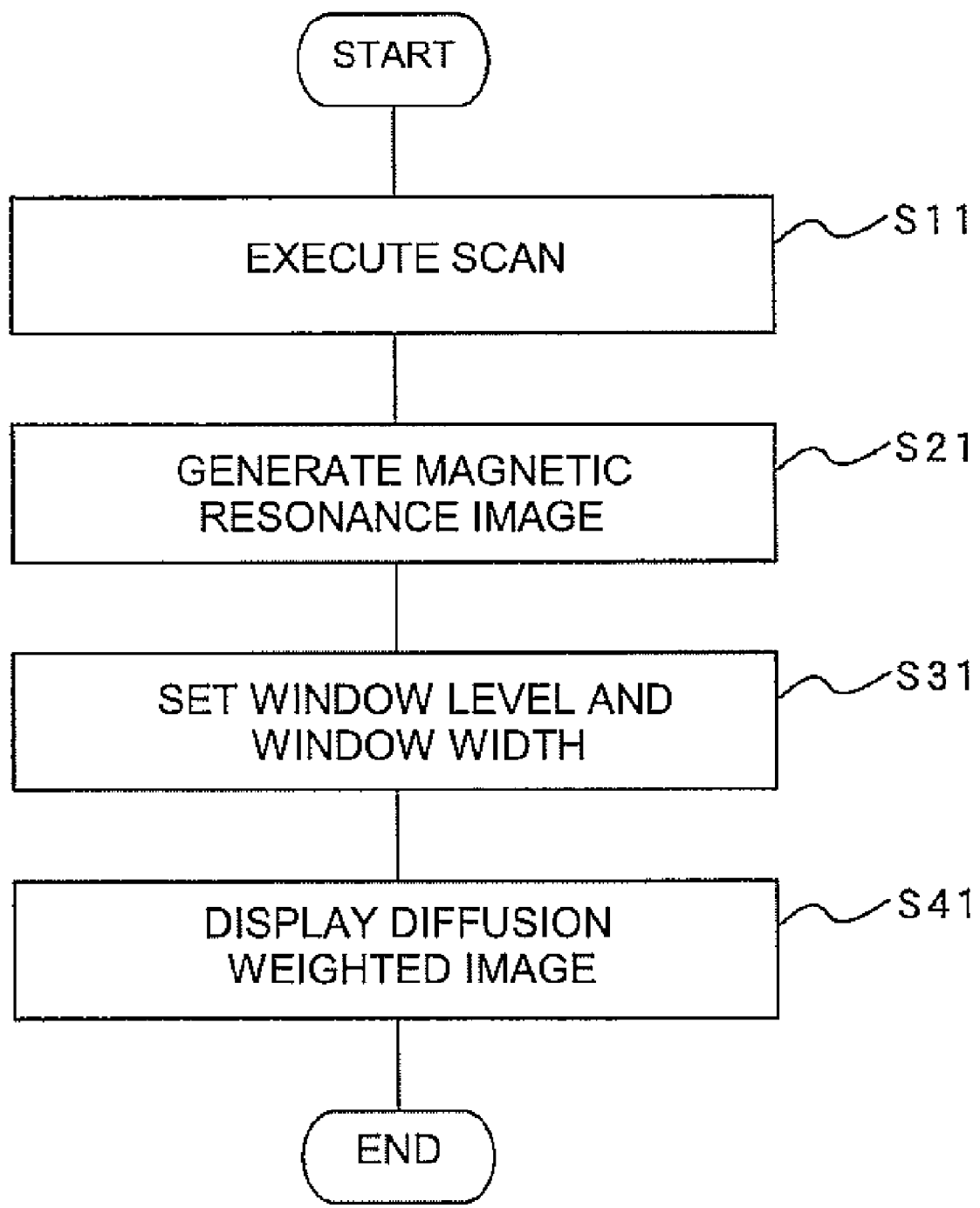
FIG. 3 is a flow chart showing the operation of generating and displaying a diffusion weighted image in the embodiment 1 according to the invention.
Figure 4:
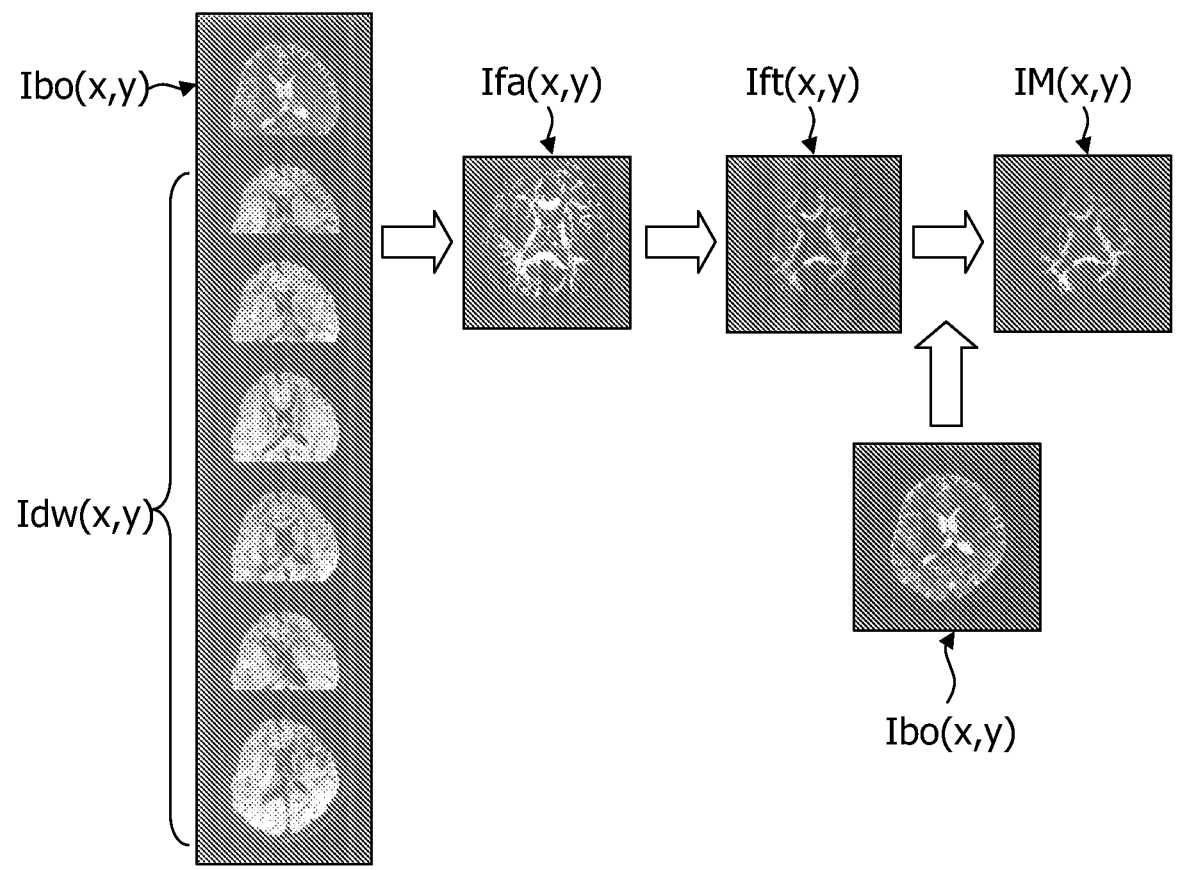
FIG. 4 is a diagram showing data generated when a diffusion weighted image is generated and displayed in the embodiment 1 according to the invention.

FIG. 3 is a flow chart showing the operation of generating and displaying a diffusion weighted image in the embodiment 1 according to the invention. FIG. 4 is a diagram showing data generated when a diffusion weighted image is generated and displayed in the embodiment 1 according to the invention.

When the diffusion weighted image is generated and displayed, the execution of a scan is first conducted as shown in FIG. 3 (S11).

Here, the scan section 2 executes a diffusion weighted imaging pulse sequence on the imaging area of the subject SU within the imaging space B thereby to acquire magnetic resonance signals. The scan section 2 scans a three-dimensional area containing a diffusion anisotropic structure as an imaging area as in the case of the brain of the subject SU being a human body to acquire magnetic resonance signals from the imaging area.

Described specifically, the scan is done in accordance with a pulse sequence in which MPG pulses equal in magnitude are disposed symmetrically so as to interpose each refocusing pulse therebetween, by means of an SE-EPI method for transmitting RF pulses of an excitation pulse whose flip angle is 90° and a refocusing pulse whose flip angle is 180°, for example, after the setting of slices imaged in the imaging area corresponding to the three-dimensional area and the number of the slices. That is, the scan is done by a PGSE method.

In the present embodiment, the above scan is done in such a manner that diffusion tensor imaging is executed. That is, in order to calculate a diffusion tensor corresponding to a diagonal matrix and calculates diffusion parameters such as fractional anisotropy values, an average or mean diffusivity value, etc., the scan is executed on the corresponding imaging area of the subject in accordance with a plurality of pulse sequences for applying MPG pulses in such a way as to differ in b-factor or applying direction, respectively. For example, a pulse sequence for applying MPG pulses in each of which a b-factor is a predetermined value other than 0 is executed in six ways such that the directions to apply the MPG pulses are different from one another. Along with it, a pulse sequence free of application of each MPG pulse is done.

Next, the generation of each magnetic resonance image is done as shown in FIG. 3 (S21).

Here, the image generating part 311 reconstructs each magnetic resonance image with respect to the imaging area of the subject from the magnetic resonance signals acquired by the scan executed in accordance with the diffusion weighted imaging pulse sequence as described above.

Described specifically, as shown in FIG. 4, a T2 weighted image Ib0 (x, y) and a diffusion weighted image Idw (x, y) are respectively produced or generated as magnetic resonance images. Here, the image generating part 311 reconstructs the T2 weighted image Ib0 (x, y) corresponding to a so-called b0 image from or based on the magnetic resonance signals acquired by executing the scan in accordance with the pulse sequence free of application of the MPG pulses in the above. The image generating part 311 reconstructs six sheets of diffusion weighted images Idw (x, y), based on the magnetic resonance signals acquired by executing the scans in accordance with the six types of pulse sequences different from one another in the direction to apply the MPG pulses in the above, respectively.

A fractional anisotropy image Ifa (x, y) is generated as a magnetic resonance image, based on the so-produced T2 weighted image Ib0 (x, y) and diffusion weighted image Idw (x, y) as shown in FIG. 4. Here, the fractional anisotropy value is calculated as a diffusion parameter so as to correspond to each pixel, based on the pixel values of the T2 weighted image Ib0 (x, y) and the diffusion weighted image Idw (x, y). Thereafter, each fractional anisotropy value is mapped as the pixel value so as to correspond to the imaging area, thereby generating the corresponding fractional anisotropy image Ifa (x, y).

When the fractional anisotropy image Ifa (x, y) is generated, a diffusion tensor D is first calculated from the magnetic resonance signals acquired by scanning, as a symmetric matrix with three rows and three columns so as to correspond to the respective pixels.

At the MPG pulses applied in the six types of directions, the intensity Gi of MPG applied in an i direction is given as expressed in the following equation (1). The intensity Si of each magnetic resonance signal obtained at that time is given as expressed in the following equation (3) using a diffusion tensor D expressed in the following equation (2). Therefore, when the MPG pulses are applied in plural directions different from one another, the following equation (4) is derived from the equations (1) and (2). Thus, the diffusion tensor D can be calculated by solving the equation (4). Incidentally, in the following, b indicates a b-factor, and So indicates the intensity of each magnetic resonance signal acquired when b=0.

Equation 1

$$G_i = (g_{xi}, g_{yi}, g_{zi}) \tag{1}$$

Equation 2

$$S_i = S_0 \cdot \exp(-b G_i^T D G_i) \tag{2}$$

Equation 3

$$D = \begin{pmatrix} D_{XX} & D_{XY} & D_{XZ} \\ D_{YX} & D_{YY} & D_{YZ} \\ D_{ZX} & D_{ZY} & D_{ZZ} \end{pmatrix} \tag{3}$$

Equation 4

$$\begin{bmatrix} \cdots & \cdots & \cdots & \cdots & \cdots & \cdots \\ \cdots & \cdots & \cdots & \cdots & \cdots & \cdots \\ (g_{xi})^2 & (g_{yi})^2 & (g_{zi})^2 & 2g_{xi}g_{yi} & 2g_{yi}g_{zi} & 2g_{zi}2g_{xi} \\ \cdots & \cdots & \cdots & \cdots & \cdots & \cdots \\ \cdots & \cdots & \cdots & \cdots & \cdots & \cdots \\ \cdots & \cdots & \cdots & \cdots & \cdots & \cdots \end{bmatrix} \tag{4}$$

$$\begin{bmatrix} D_{XX} \\ D_{YY} \\ D_{ZZ} \\ D_{XY} \\ D_{YZ} \\ D_{ZX} \end{bmatrix} = \begin{bmatrix} \cdots \\ \cdots \\ -\frac{1}{b}\log\left(\frac{S_i}{S_0}\right) \\ \cdots \\ \cdots \\ \cdots \end{bmatrix}$$

Thereafter, the diffusion tensor D determined in the above-described manner is diagonalized to calculate an eigen or intrinsic value $\lambda i$ (where i=1, 2, 3) and an eigen or intrinsic vector.

As expressed in the following equation (5), a fractional anisotropy value FA corresponding to a value indicative of diffusion anisotropy is calculated using the intrinsic value $\lambda i$ (where i=1, 2, 3). A fractional anisotropy image Ifa (x, y) is generated using the calculated fractional anisotropy value FA.

Equation 5

$$FA = \left( \frac{3}{2} \cdot \frac{\sum_{i=1}^{3}\left(\lambda i - \frac{1}{3}\right)^2}{\sum_{i=1}^{3} \lambda i^2} \right)^{1/2} \quad (5)$$

Next, as shown in FIG. 3, the setting of a window level and a window width is performed (S31).

Here, the window setting part 312 sets a window level and a window width at the time that the display unit 33 displays each image. In the present embodiment, the window setting part 312 sets a window level and a window width at the time that the display unit 33 displays each magnetic resonance image generated as described above, based on the diffusion parameters calculated from the magnetic resonance signals.

In the present embodiment, the window level and the window width are set using the fractional anisotropy image Ifa (x, y) in which the fractional anisotropy values each corresponding to each of the diffusion parameters are mapped as the pixel values so as to correspond to the imaging area of the subject SU as mentioned above.

Described specifically, as shown in FIG. 4, threshold processing is first performed on the fractional anisotropy image Ifa (x, y) thereby to output a fractional anisotropy image Ift (x, y) subsequent to being subjected to the threshold processing.

Here, the threshold processing is executed based on the fractional anisotropy value to extract an area corresponding to a specific tissue at the fractional anisotropy image Ifa (x, y). Further, the present threshold processing is executed based on the average or mean diffusivity value calculated as each diffusion parameter using the T2 weighted image Ib0 (x, y) and the diffusion weighted image Idw (x, y).

For example, threshold ranges are set to the fractional anisotropy value FA and the average or means diffusivity value MD as expressed in the following equations (6) and (7) respectively so as to extract pixels corresponding to an area containing a white matter in the imaging area of the subject SU and eliminate pixels corresponding to an area containing other infarction area, whereby the threshold processing is executed.

Equation 6

$$FA > 0.4 \quad (6)$$

Equation 7

$$0.65 \times 10^{-3} (mm^2/s) < MD < 0.9 \times 10^{-3} (mm^2/s) \quad (7)$$

That is, such pixels that the fractional anisotropy value FA exceeds 0.4 and the mean diffusivity value MD exceeds $0.65 \times 10^{-3}$ mm²/s and is less than $0.9 \times 10^{-3}$ mm²/s are extracted from the pixels that constitute the fractional anisotropy image Ifa (x, y), thereby generating the corresponding fractional anisotropy image Ift (x, y) subsequent to the threshold processing as an image in which the white matter area has been extracted.

Next, as shown in FIG. 4, a mask image IM (x, y) is produced from the fractional anisotropy image Ift (x, y) subsequent to the threshold processing and the T2 weighted image Ib0 (x, y).

Here, the window setting part 312 assign weights to the threshold-processed fractional anisotropy image If (x, y), based on the T2 weighted image Ib0 (x, y) as expressed in the following equation (8), thereby generating a mask image IM (x, y). That is, the corresponding mask image IM (x, y) is generated by executing an integrating process for integrating respective pixel values of the threshold-processed fractional anisotropy image If (x, y) and the T2 weighted image Ib0 (x, y) every pixel. Thus, as shown in FIG. 4, noise components that remain in the background at the threshold-processed fractional anisotropy image Ift (x, y) can be eliminated from the mask image IM (x, y).

$$IM(x, y) = If(x, y) \times Ib0(x, y) \quad (8)$$

Then, a window level WL and a window width WW are set using the pixel values of the generated mask image IM (x, y).

Here, weighted addition average processing with the pixel values of the mask image IM (x, y) as weights is performed on the pixel values of the T2 weighted image Ib0 (x, y) as expressed in the following equation (9) thereby to calculate an average value Iave.

As expressed in the equations (10) and (11), the window setting part 312 sets the average value Iave as the window width WW and sets a value equal to half of the average value Iave as the window level WL. That is, the window setting part 312 sets the window width WW such that the average value Iave calculated in the above-described manner is brought to an upper limit value of the brightness of a displayed image and sets the center value of the window width WW to the window level WL.

Equation 9

$$Iave = \frac{\sum (Ib0(x, y) \times IM(x, y))}{\sum IM(x, y)} \quad (9)$$

Equation 10

$$WW = Iave \quad (10)$$

Equation 11

$$WL = \frac{1}{2} Iave \quad (12)$$

Next, as shown in FIG. 3, the display of each diffusion weighted image is done (S41).

Here, as described above, the display unit 33 displays the diffusion weighted image Idw (x, y) generated as the magnetic resonance image by the image generating part 311 on its display screen. In the present embodiment as described above, the diffusion weighted image is displayed on the display screen so as to correspond to the window level WL and window width WW set by the window setting part 312. That is, the display unit 33 displays the diffusion weighted image Idw (x, y) on the display screen in such a manner that the average value Iave calculated in the above-described manner is brought to the upper limit value of the brightness range for displaying the image and the value equal to half of the average value Iave is brought to the center value of the brightness range.

In the present embodiment as described above, the window setting part 312 sets the window level WL and window width WW at the time that the display unit 33 displays the diffusion weighted image Idw (x, y), based on the diffusion parameters calculated by the magnetic resonance signals acquired by the scan section 2 to generate the diffusion weighted image Idw (x, y). The display unit 33 displays the diffusion weighted image Idw (x, y) on the display screen such that it corresponds to the window level WL and the window width WW set by the window setting part 312. Thus, in the present embodiment, no human error occurs because the window level WL and the window width WW are automatically set based on the diffusion parameters without setting the region of interest by the operator. Therefore, it is possible to easily display the diffusion weighted image Idw (x, y) on the display screen at the proper window level WL and width WW. With its view, an improvement in diagnostic efficiency can thus be realized.

In the present embodiment, the threshold processing is executed on the fractional anisotropy image Ifa (x, y) mapped with the fractional anisotropy values calculated as the diffusion parameters as the pixel value. Here, the present threshold processing is executed so as to extract the area corresponding to the specific tissue at the fractional anisotropy image Ifa (x, y). For example, the area corresponding to the white matter portion is extracted by the threshold processing. Described specifically, pixels lying in the range of a specific fractional anisotropy value corresponding to the white matter associated with pixel values and lying in the range of a specific mean diffusivity value are extracted at the fractional anisotropy image Ifa (x, y). The window level WL and the window width WW are set based on the pixel values of the threshold-processed fractional anisotropy image Ift (x, y). Thus, in the present embodiment, the pixels corresponding to the area containing the specific tissue such as the white matter portion can easily and accurately be extracted at the fractional anisotropy image Ifa (x, y) by executing the threshold processing on the fractional anisotropy image Ifa (x, y). Since the window level WL and the window width WW are set based on the pixel values of the pixels corresponding to the area containing the specific tissue such as the white matter portion, the diffusion weighted image Idw (x, y) is displayed with a high contrast between a specific portion such as a white matter portion and a portion other than the white matter portion as in the case of an infarction portion or the like. That is, since it is displayed on the display screen in such a manner that a high contrast is made between an infarction area intended for diagnosis at the diffusion weighted image Idw (x, y) and an area other than it, an accurate and efficient diagnosis can be realized.

In the present embodiment, the integrating process is performed in such a manner that each pixel value of the threshold-processed fractional anisotropy image Ift (x, y) and each pixel value of the T2 weighted image Ib0 (x, y) correspond to the pixels, thereby generating the mask image IM (x, y). Thereafter, the window level WL and the window width WW are set using the pixel values of the generated mask image IM (x, y). At the mask image IM (x, y) generated in the above-described manner, the noise components that remain in the background at the post-threshold processing fractional anisotropy image Ift (x, y) are removed from the mask image IM (x, y) generated in the above-described manner as mentioned above. Thus, since the window level WL and the window width WW are set based on the pixel values of the mask image IM (x, y) from which the noise components have been removed, in the present embodiment, the diffusion weighted image can be displayed in such a manner that a higher contrast is made between the infarction portion intended for diagnosis at the diffusion weighted image Idw (x, y) and the area other than it.

The weighted addition average processing with the pixel values of the mask image IM (x, y) as weights is performed on the pixel values of the T2 weighted image Ib0 (x, y) thereby to calculate the average value Iave. Thereafter, the average value Iave is set as the window width WW and the value equal to half of the average value Iave is set as the window level WL. That is, the window level WL and the window width WW are set by using the T2 weighted image Ib0 (x, y) as the reference image. Therefore, the present embodiment can obtain an effect in that it is hard to be affected by image noise and performs the W/L settings.

An embodiment 2 according to the invention will be explained below.

The present embodiment is different from the embodiment 1 in Step (S31) for setting the window level WL and the window width WW. Except for this point, the present embodiment is similar to the embodiment 1. Thus, the description of dual portions will be omitted.

In the present embodiment, a mask image IM (x, y) is generated in a manner similar to the embodiment 1 when the window level WL and the window width WW are set (S31). Thereafter, the window level WL and the window width WW are set using the pixel values of the generated mask image IM (x, y).

Here, binary processing for binarization is executed on the values of pixels that constitute the mask image IM (x, y) thereby to generate a binary mask image IMb (x, y).

Thereafter, as expressed in the following equation (12), weighted addition average processing with pixel values of the binary mask image IMb (x, y) as weights is performed on the pixel values of a T2 weighted image Ib0 (x, y) thereby to calculate an average value Iave.

Equation 12

$$Iave = \frac{\sum (Ib0(x, y) \times IMb(x, y))}{\sum IMb(x, y)} \quad (12)$$

As expressed in the equations (10) and (11) in a manner similar to the embodiment 1, a window setting part 312 sets the average value Iave as the window width WW and sets the value equal to half of the average value Iave as the window level WL.

In a manner similar to the embodiment 1, a diffusion weighted image is displayed on a display screen so as to correspond to the set window level WL and window width WW.

In the present embodiment as described above, the window level WL and the window width WW are automatically set based on diffusion parameters in a manner similar to the embodiment 1 without setting a region of interest by an operator. Therefore, the diffusion weighted image Idw (x, y) can easily be displayed on the display screen at the proper window level WL and width WW. With its view, an improvement in diagnostic efficiency can be realized.

The weighted addition average processing is executed on the pixel values of the T2 weighted image Ib0 (x, y) with the pixel values of the binary mask image Ib0 (x, y) obtained by binarizing the mask image IM (x, y), as weights, thereby calculating the average value Iave. Thereafter, the window width WW and the window level WL are set using the average value Iave. Therefore, the present embodiment can obtain an effect in that since signals at white matter areas are handled or processed with the same weighting, the determination of W/L by a signal value at a specific white matter area (callosal ampulla or the like) high in FA is prevented.

An embodiment 3 according to the invention will be explained below.

The present embodiment is different from the embodiment 1 in terms of Step (S31) for setting the window level and the window width. Except for this point, the present embodiment is similar to the embodiment 1. Thus, the description of dual portions will be omitted.

In the present embodiment, a mask image IM (x, y) is generated in a manner similar to the embodiment 1 when the window level and the window width arc set (S31).

Thereafter, the window level WL and the window width WW are set using the pixel values of the generated mask image IM (x, y).

Here, weighted addition average processing with the pixel values of the mask image IM (x, y) as weights is performed on the pixel values of the diffusion weighted image Idw (x, y) as expressed in the following equation (13) thereby to calculate an average value Iave.

As expressed in the equations (14) and (15), a window setting part 312 sets a value equal to twice the average value Iave as the window width WW and sets the average value Iave as the window level WL. That is, the window setting part 312 sets the window width WW such that the value equal to twice the average value Iave calculated in the above-described manner is brought to an upper limit value of the brightness of a displayed image and sets the center value of the window width WW to the window level WL.

Equation 13

$$Iave = \frac{\sum (Idw(x, y) \times IM(x, y))}{\sum IM(x, y)} \quad (13)$$

Equation 14

$$WW = 2 \times Iave \quad (14)$$

Equation 15

$$WL = Iave \quad (15)$$

In the present embodiment as described above, the window level WL and the window width WW are automatically set based on the diffusion parameters without setting a region of interest by an operator in manner similar to the embodiment 1. Therefore, the diffusion weighted image Idw (x, y) can easily be displayed on the display screen at the proper window level WL and width WW because no human error occurs. With its view, an improvement in diagnostic efficiency can be thus realized.

The weighted addition average processing with the pixel values of the mask image IM (x, y) as the weights is performed on the pixel values of the diffusion weighted image Idw (x, y) thereby to calculate the average value Iave. Thereafter, twice the average value Iave is set as the window width WW, and the average value Iave is set as the window level WL. That is, the window level WL and the window width WW are set by using the diffusion weighted image Idw (x, y) as a reference image. Therefore, the present embodiment can obtain an effect in that it is hard to be affected by long components (cerebral fluid, abscess, etc.) of T2 because the diffusion weighted contrast is used in W/L setting.

An embodiment 4 according to the invention will be explained below.

The present embodiment is different from the embodiment 3 in terms of Step (S31) for setting the window level and the window width. Except for this point, the present embodiment is similar to the embodiment 3. Thus, the description of dual portions will be omitted.

The present embodiment is different from the embodiment 3 in terms of Step (S31) for setting a window level WL and a window width WW. Except for this point, the present embodiment is similar to the embodiment 1. Thus, the description of dual portions will be omitted.

In the present embodiment, a mask image IM (x, y) is generated in a manner similar to the embodiment 3 when the window level WL and the window width WW are set (S31). Thereafter, the window level WL and the window width WW are set using the pixel values of the generated mask image IM (x, y).

Here, binary processing for binarization is executed on the values of pixels that constitute the mask image IM (x, y) thereby to generate a binary mask image IMb (x, y). When, for example, the pixel value of each pixel that constitutes the mask image IM (x, y) is larger than a predetermined threshold value, the pixel value of each pixel that constitutes the binary mask image IMb (x, y) is brought to 1. When the pixel value of each pixel that constitutes the mask image IM (x, y) is smaller than the predetermined threshold value, the pixel value of each pixel that constitutes the binary mask image IMb (x, y) is brought to 0, whereby the corresponding binary mask image IMb (x, y) is produced.

Thereafter, as expressed in the following equation (16), weighted addition average processing with the pixel values of the binary mask image IMb (x, y) as weights is performed on the pixel values of a diffusion weighted image Idw (x, y) thereby to calculate an average value Iave.

Equation 16

$$Iave = \frac{\sum (Idw(x, y) \times IMb(x, y))}{\sum IMb(x, y)} \quad (16)$$

In a manner similar to the embodiment 3, a window setting part 312 sets the average value Iave as a window width WW and sets a value equal to half of the average value Iave as a window level WL. A diffusion weighted image is displayed on a display screen so as to correspond to the set window level WL and window width WW.

In the present embodiment as described above, the window level WL and the window width WW are automatically set based on the diffusion parameters without setting a region of interest by an operator in manner similar to the embodiment 3. Therefore, the diffusion weighted image Idw (x, y) can easily be displayed on the display screen at the proper window level WL and width WW because no human error occurs. With its view, an improvement in diagnostic efficiency can be thus realized.

The weighted addition average processing is executed on the pixel values of the diffusion weighted image Idw (x, y) with the pixel values of the binary mask image IMb (x, y) obtained by binarizing the mask image IM (x, y), as the weights, thereby calculating the average value Iave. Thereafter, the window width WW and the window level WL are set using the average value Iave.

Therefore, the present embodiment can obtain an effect in that since signals at white matter areas are handled or processed with the same weighting, the determination of W/L by a signal value at a specific white matter area (callosal ampulla or the like) high in FA is prevented.

Incidentally, in the above embodiment, the magnetic resonance imaging apparatus 1 is equivalent to the magnetic resonance imaging apparatus of the invention. In the above embodiment, the scan section 2 is equivalent to the scan section of the invention. In the above embodiment, the display unit 33 is equivalent to the display unit of the invention. In the above embodiment, the image generating part 311 corresponds to the image generating part of the invention. In the above embodiment, the window setting part 312 is equivalent to the window setting part of the invention.

Upon implementation of the invention, the invention is not limited to the above-described embodiments, and various modifications can be adopted.

Although the above embodiments have explained where the window level and the window width are set using the diffusion parameters, fractional anisotropy value and average diffusion capacity value, for example, the invention is not limited to it. The window level and the window width may be set based on other diffusion parameters as in relative anisotropy values or the like, for example. When DWI is used, the dispersion of diffusion coefficients in three-axis directions including x, y and z directions may be substituted for the fractional anisotropy value as an anisotropic index.

Although the above embodiments have explained where the diffusion weighted image is displayed, the invention is not limited to it. When, for example, a nerve fiber image generated by tractgraphy is displayed, it may be applied to a case in which the window level WL and the window width WW are set and displayed as described above when the magnetic resonance image generated by execution of the diffusion weighted imaging pulse sequence is displayed as in the case of the T2 weighted image and the diffusion weighted image and the like each used as the background image. In this case, the window level WL and the window width WW may preferably be set as expressed in the following equations (17) and (18).

Equation 17

$$WW = I_{ave} \times 2 \quad (17)$$

Equation 18

$$WL = I_{ave} \quad (18)$$

Although the present embodiment has explained where the T2 weighted image is displayed as the b0 image generated without applying the MPG pulses, the invention is not limited to it. The invention is applicable even to, for example, a case in which a proton weighted image is displayed.

Although a description has been made of the case in which the window level WL and the window width WW are set based on the above-described equations, the invention is not limited to it.

Since an anisotropy diffusion weighted image is preferably used as a reference image to avoid the influence of diffusion anisotropy upon display of the diffusion weighted image, it is preferable to apply each value calculated from Iiso to all of six sheets of diffusion weighted images and thereby set a window level WL and a window width WW, for example. In addition to it, an image Iiso (x, y) expressed in the following equation (19) may be configured so as to be displayed by the set window level WL and the window width WW.

Equation 19

$$I_{iSO}(x, y) = I_{b0}(x, y) \times \exp(-b \times MD(x, y)) \quad (19)$$

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus comprising:
a scan section configured to execute a diffusion weighted imaging pulse sequence on an imaging area of a subject within a static magnetic field space in order to acquire magnetic resonance signals;
an image generating part configured to generate an image with respect to the imaging area based on the magnetic resonance signals acquired by the scan section;
a display unit configured to display the image generated by the image generating part on a display screen; and
a window setting part configured to automatically set a window level and a window width at a time that the display unit displays the image, the window level and the window width setting based on diffusion parameters calculated from the magnetic resonance signals acquired by the scan section without receiving a region of interest input from an operator, wherein the display unit is configured to display the image on the display screen according to the window level and the window width set by the window setting part.

2. The magnetic resonance imaging apparatus according to claim 1, wherein the image generating part is configured to generate each of a b0 image and a diffusion weighted image as the image based on the magnetic resonance signals.

3. The magnetic resonance imaging apparatus according to claim 2, wherein the image generating part is configured to generate a T2 weighted image as the b0 image.

4. The magnetic resonance imaging apparatus according to claim 3, wherein the window setting part is configured to set the window level and the window width using a fractional anisotropy image in which fractional anisotropy values are mapped as pixel values, the fractional anisotropy values calculated as the diffusion parameters based on the T2 weighted image and the diffusion weighted image.

5. The magnetic resonance imaging apparatus according to claim 4, wherein the window setting part is configured to execute threshold processing on the fractional anisotropy image and to set the window level and the window width based on pixel values of the fractional anisotropy image subjected to the threshold processing.

6. The magnetic resonance imaging apparatus according to claim 5, wherein the window setting part is configured to extract an area corresponding to a specific tissue at the fractional anisotropy image by executing the threshold processing.

7. The magnetic resonance imaging apparatus according to claim 6, wherein the window setting part is configured to execute the threshold processing based on the corresponding fractional anisotropy value.

8. The magnetic resonance imaging apparatus according to claim 6, wherein the window setting part is configured to execute the threshold processing based on a mean diffusivity value calculated as the diffusion parameter using the T2 weighted image and the diffusion weighted image.

9. The magnetic resonance imaging apparatus according to claim 5, wherein the window setting part is configured to perform integrating processing on the pixel values of the fractional anisotropy image subjected to the threshold processing and pixel values of the T2 weighted image in order to generate a mask image and to set the window level and the window width using pixel values of the generated mask image.

10. The magnetic resonance imaging apparatus according to claim 9, wherein the window setting part is configured to execute weighted addition average processing with the pixel values of the mask image as weights on the pixel values of the T2 weighted image in order to calculate an average value, and to set the average value as the window width and sets a value equal to half of the average value as the window level.

11. The magnetic resonance imaging apparatus according to claim 9, wherein the window setting part is configured to execute the weighted addition average processing with the pixel values of the mask image as the weights on pixel values of the diffusion weighted image in order to calculate an average value, and to set the average value as the window level and to set a value equal to twice the average value as the window width.

12. A magnetic resonance image displaying method comprising:

generating an image with respect to an imaging area of a subject based on magnetic resonance signals acquired by executing a diffusion weighted imaging pulse sequence on the imaging area within a static magnetic field space;

displaying the generated image on a display screen; and automatically setting a window level and a window width at the time that the image is displayed on the display screen based on diffusion parameters calculated from the magnetic resonance signals without receiving a region of interest input from an operator, wherein the image is displayed on the display screen according to the window level and the window width and has a white matter area extracted.

13. The magnetic resonance image displaying method according to claim 12, wherein generating an image comprises generating a b0 image and a diffusion weighted image based on the magnetic resonance signals.

14. The magnetic resonance image displaying method according to claim 13, wherein generating an image comprises generating a T2 weighted image as the b0 image.

15. The magnetic resonance image displaying method according to claim 14, wherein setting a window level and a window width comprises setting the window level and the window width using a fractional anisotropy image mapped with fractional anisotropy values as pixel values, the fractional anisotropy values calculated as the diffusion parameters based on the T2 weighted image and the diffusion weighted image.

16. The magnetic resonance image displaying method according to claim 15, wherein setting a window level and a window width further comprises executing threshold processing on the fractional anisotropy image and setting the window level and the window width based on pixel values of the fractional anisotropy image.

17. The magnetic resonance image displaying method according to claim 16, wherein setting a window level and a window width further comprises extracting an area corresponding to a specific tissue at the fractional anisotropy image by executing the threshold processing.

18. The magnetic resonance image displaying method according to claim 17, wherein setting a window level and a window width further comprises executing threshold processing based on the corresponding fractional anisotropy value.

19. The magnetic resonance image displaying method according to claim 17, wherein setting a window level and a window width further comprises executing threshold processing based on a mean diffusivity value calculated as the diffusion parameter using the T2 weighted image and the diffusion weighted image.

20. The magnetic resonance image displaying method according to claims 16, wherein setting a window level and a window width further comprises performing integrating processing on the pixel values of the fractional anisotropy image subjected to the threshold processing and pixel values of the T2 weighted image in order to generate a mask image and setting the window level and the window width using pixel values of the generated mask image.

* * * * *